United States Patent
Chen et al.

(10) Patent No.: US 7,907,696 B2
(45) Date of Patent: Mar. 15, 2011

(54) SHIFT REGISTER

(75) Inventors: Wen-pin Chen, Hsin-Chu (TW);
Lee-hsun Chang, Hsin-Chu (TW);
Je-hao Hsu, Hsin-Chu (TW)

(73) Assignee: Au Optronics Corp., Hsin-Chu (TW)

( * ) Notice: Subject to any disclaimer, the term of this patent is extended or adjusted under 35 U.S.C. 154(b) by 49 days.

(21) Appl. No.: 12/429,018

(22) Filed: Apr. 23, 2009

(65) Prior Publication Data

US 2010/0054392 A1 Mar. 4, 2010

(30) Foreign Application Priority Data

Aug. 27, 2008 (TW) ................................ 97132745 A

(51) Int. Cl.
*G11C 19/00* (2006.01)
(52) U.S. Cl. ................. 377/64; 377/68; 377/69; 377/78; 377/79
(58) Field of Classification Search ........................ None
See application file for complete search history.

(56) References Cited

U.S. PATENT DOCUMENTS

| 5,410,583 | A | 4/1995 | Weisbrod et al. | |
|---|---|---|---|---|
| 6,339,631 | B1 * | 1/2002 | Yeo et al. | 377/64 |
| 7,286,627 | B2 * | 10/2007 | Tsai et al. | 377/64 |
| 7,664,218 | B2 * | 2/2010 | Tobita | 377/64 |
| 2007/0297559 | A1 * | 12/2007 | Cho et al. | 377/64 |

* cited by examiner

*Primary Examiner* — Tuan Lam
(74) *Attorney, Agent, or Firm* — Kirton & McConkie; Evan R. Witt

(57) ABSTRACT

A shift register includes a plurality of stages cascade-connected with each other. Each stage includes a pull-up circuit, a pull-up driving circuit, and a pull-down circuit. The pull-up circuit coupled to a first clock signal is used for providing an output signal. The pull-up driving circuit includes a control circuit and a first transistor. The control circuit has a gate coupled to a previous stage, and a drain coupled to a second clock signal. The first transistor includes a gate coupled to the source of the control circuit, a drain coupled to a driving end of the previous stage, and a source coupled to a first input end. The pull-down circuit pulls down voltage on the first input end.

25 Claims, 7 Drawing Sheets

SHIFT REGISTER

BACKGROUND OF THE INVENTION

1. Field of the Invention

The present invention relates to a shift register, and more particularly, to a shift register capable of compensating a threshold voltage variation of a transistor.

2. Description of the Related Art

With a rapid development of monitor types, novel and colorful monitors with high resolution, e.g., liquid crystal displays (LCDs), are indispensable components used in various electronic products such as monitors for notebook computers, personal digital assistants (PDAs), digital cameras, and projectors. The demand for the novelty and colorful monitors has increased tremendously.

Referring to FIG. 1 showing a functional block diagram of a conventional liquid crystal display 10, the liquid crystal display 10 includes a liquid crystal panel 12, a gate driver 14, and a source driver 16. The liquid crystal panel 12 includes a plurality of pixels, each pixel having three pixel units 20 indicating three primary colors, red, green, and blue. For example, the liquid crystal display 12 with 1024 by 768 pixels contains a number of 1024×768×3 pixel units 20. The gate driver 14 periodically outputs a scanning signal to turn on each transistor 22 of the pixel units 20 row by row, meanwhile, each pixel units 20 is charged to a corresponding voltage based on a data signal from the source driver 16, to show various gray levels. After a row of pixel units is finished to be charged, the gate driver 14 stops outputting the scanning signal to this row, and then outputs the scanning signal to turn on the transistors 22 of the pixel units of the next row. Sequentially, until all pixel units 20 of the liquid crystal panel 12 finish charging, and the gate driver 14 outputs the scanning signal to the first row again and repeats the above-mentioned mechanism.

As to the conventional liquid crystal display, the gate driver 14 functions as a shift register. In other words, the gate driver 16 outputs a scanning signal to the liquid crystal display 12 at a fixed interval. For instance, a liquid crystal display 12 with 1024×768 pixels and its operating frequency with 60 Hz is provided, the display interval of each frame is about 16.67 ms (i.e., 1/60 second), such that an interval between two scanning signals applied on two row adjacent lines is about 21.7 μs (i.e., 16.67 ms/768). The pixel units 20 are charged and discharged by data voltage from the source driver 16 to show corresponding gray levels in the time period of 21.7 μs accordingly.

Unfortunately, regarding the gate driver 14 manufactured with an amorphous silicon (a-Si) technology, the liquid crystal display 12 may display unevenly due to a voltage stress phenomenon which causes a discrepancy of threshold voltages of any two transistors.

SUMMARY OF THE INVENTION

It is therefore an object of the present invention to provide a shift register capable of compensating a threshold voltage variation of a transistor, thereby effectively solving the above-mentioned problem existing in the prior art.

Briefly summarized, a shift register comprises a plurality of stages connected in cascade. Each stage comprises a pull-up circuit and a pull-down circuit. The pull-up circuit is coupled to a first clock signal for generating an output signal. The pull-down circuit is used for providing a supply voltage to the input node of the pull-up circuit. The pull-up driving circuit coupled to the pull-up circuit comprises a control circuit and a first transistor. The control circuit comprises a first input end coupled to an input node of a pull-up circuit of a previous stage, and a second input end coupled to a second clock signal, and a third input end. The first transistor comprises a gate coupled to the third input of the control circuit, a drain coupled to a driving signal end of the previous stage, and a source coupled to an input node of the pull-up circuit. The first clock signal is out of phase with the second clock signal by 180 degrees.

According to the present invention, the control circuit comprises a second transistor comprising a gate coupled to the first input end of the control circuit, a drain coupled to the second input end of the control circuit, and a source coupled to the third input end of the control circuit.

According to the present invention, the gate of the second transistor is coupled to the input end of the pull-up circuit of the previous stage, the drain of the second transistor is coupled to the second clock signal, and the source of second transistor is coupled to the gate of the first transistor.

According to the present invention, the pull-up driving circuit further comprises a third transistor comprising a gate coupled to the first clock signal, a drain coupled to the source of the second transistor, and a source coupled to a driving signal end of a next stage.

According to the present invention, the pull-up circuit comprises a fourth transistor and a fifth transistor. The fourth transistor comprises a drain coupled to the first clock signal, a gate coupled to the input node of the pull-up circuit, and a source coupled to an output end. The fifth transistor comprises a drain coupled to the first clock signal, a gate coupled to the input node of the pull-up circuit, and a source coupled to a driving signal end.

These and other objectives of the present invention will become apparent to those of ordinary skill in the art after reading the following detailed description of the preferred embodiment that is illustrated in the various figures and drawings.

DETAILED DESCRIPTION OF THE PREFERRED EMBODIMENTS

Figure 1:
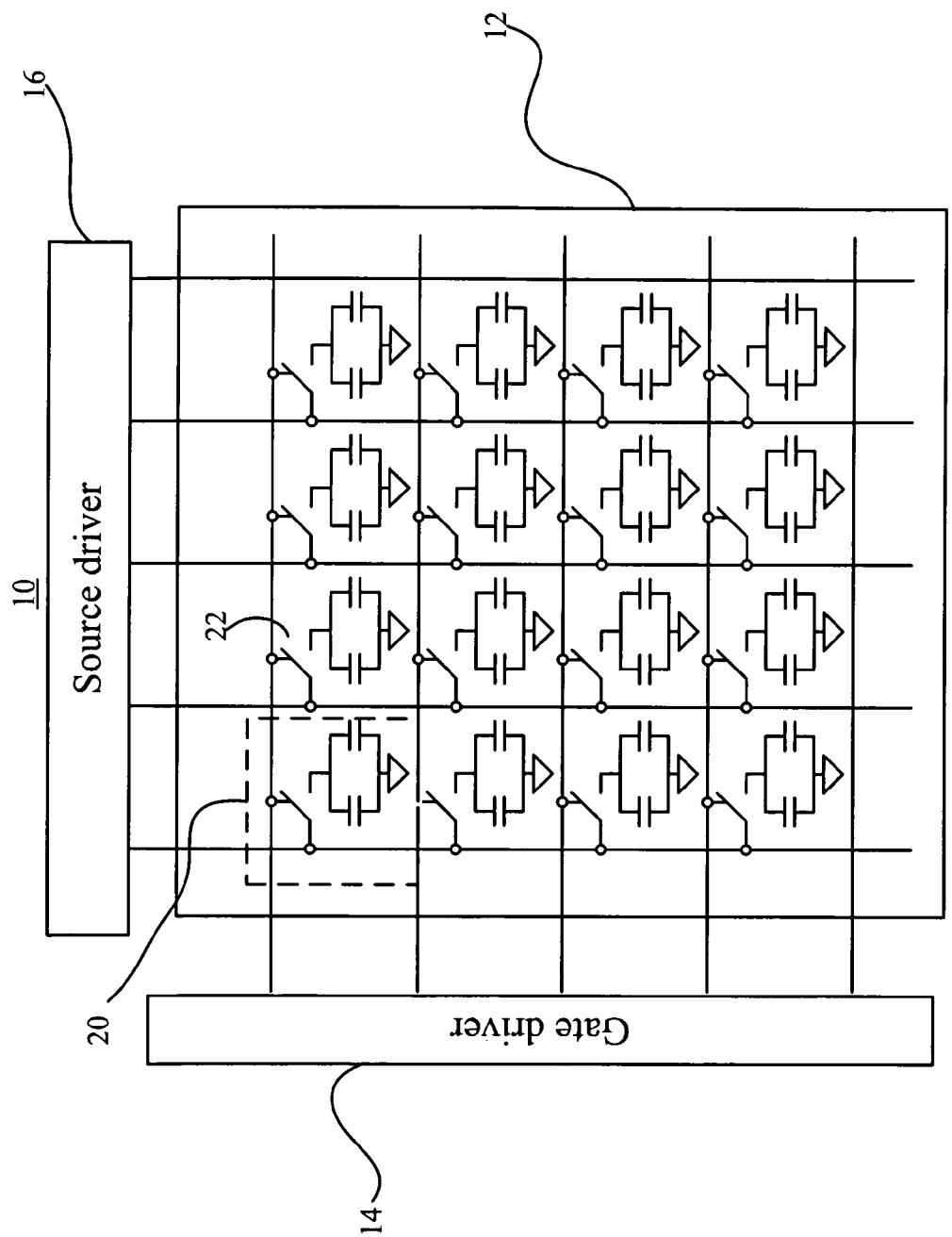
FIG. 1 shows a functional block diagram of a conventional liquid crystal display.
Figure 2:
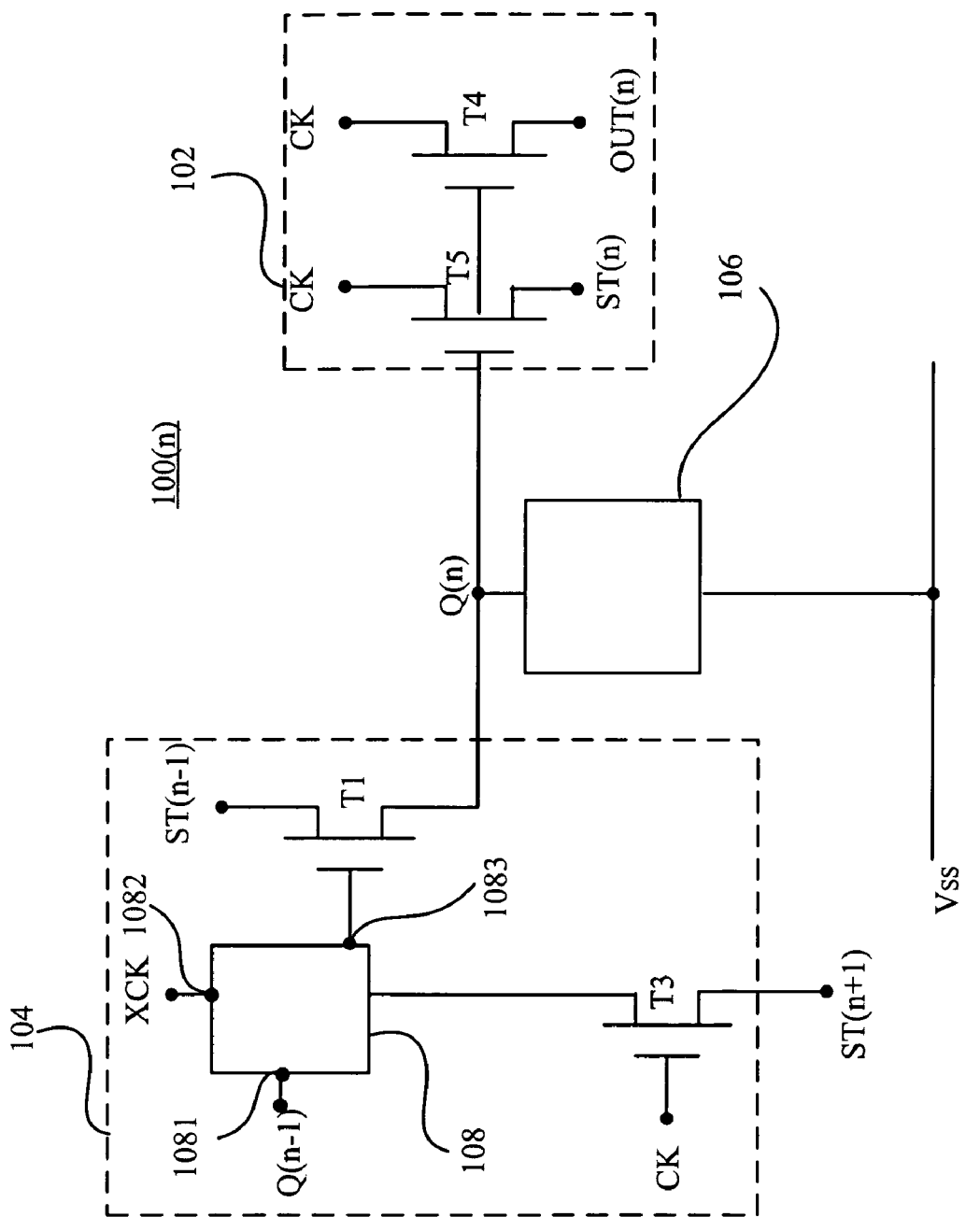
FIG. 2 shows a block diagram of a stage of the shift register of the present invention.

Referring to FIG. 2 showing a block diagram of a stage 100(n) of the shift register of the present invention, the shift register of the embodiment can be applied to a liquid crystal display. The shift register comprises a plurality of cascade-connected shift register units (hereinafter referred as stage) 100(n). Each stage 100(n) outputs a scan signal according to a first clock signal CK, a second clock signal XCK, and a driving signal from a previous stage 100 (*n*−1). When a first stage 100(1) receives a start pulse Vst from an input end ST(0), the stage 100(1) outputs an output signal at an output end OUT(1) in the next clock cycle. Similarly, each stage 100(*n*) outputs an output signal at an output end OUT(n) in the next clock cycle, according to a first clock signal CK, a second clock signal XCKE, and a driving signal from a driving signal end ST(n−1) of a stage 100(*n*−1). The output signal is a scanning signal for turning on corresponding pixel transistors. The first clock signal CK is out of phase with the second clock signal XCK by 180 degrees.

Each stage 100 (*n*) comprises a pull-up circuit 102, a pull-up driving circuit 104, and a pull-down circuit 106. The pull-up circuit 102 is coupled with the first clock signal CK, providing an output signal at the output end OUT(n). The pull-up driving circuit 104 is turned on when receiving the driving signal from the stage 100 (*n*−1) and the second clock signal XCK. The pull-down circuit 106 is coupled to a supply voltage Vss.

The pull-up driving circuit 104 is coupled with the pull-up circuit 102 at a input node Q(n). As depicted in FIG. 2, the pull-up driving circuit 104 comprises a control circuit 108, a first transistor T1, and a second transistor T3. A first end 1081 of the control circuit 108 is coupled to a input node Q(n−1) of a stage 100 (*n*−1), and a second end 1082 of the control circuit 108 is coupled to the second clock signal XCK. The first transistor T1 comprises a gate coupled to a third end 1083 of the control circuit 108, and a drain is coupled to a driving signal end ST(n−1) of the stage 100 (*n*−1), and a source coupled to the input node Q(n).

Figure 3A:
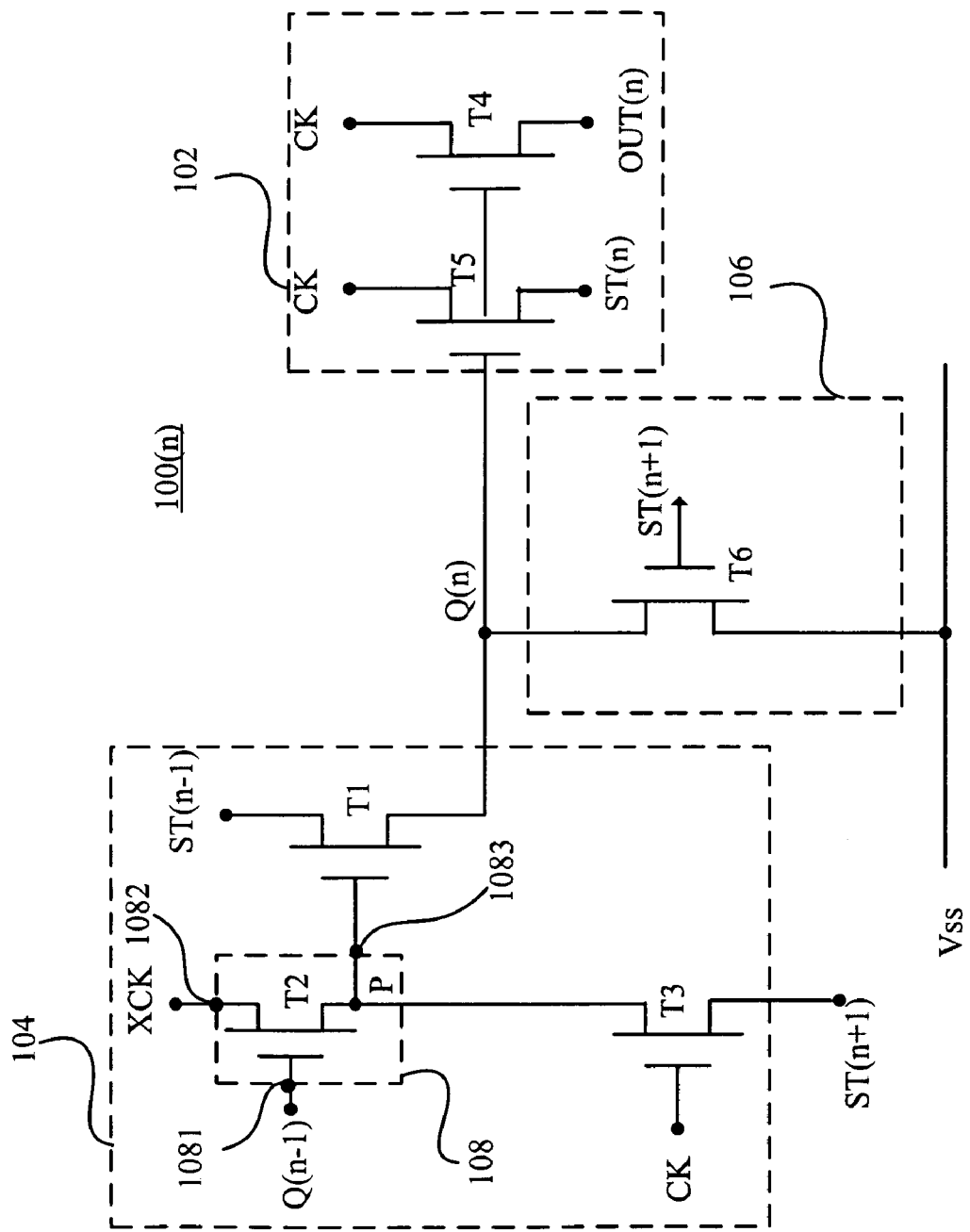
FIG. 3A illustrates a circuit diagram of a stage of the shift register according to a first embodiment of the present invention.

Referring to FIG. 3A illustrating a circuit diagram of a stage of the shift register according to a first embodiment of the present invention, the pull-up driving circuit 104 is coupled to the pull-up circuit 102 at the input node Q(n). In this embodiment, the control circuit 108 comprises a second transistor T2 of which a gate is coupled to the input node Q(n−1) of the stage 100 (*n*−1), and a drain is coupled to the second clock signal XCK. The first transistor T1 comprises a gate coupled to a source of the second transistor T2, a drain coupled to the driving signal end ST(n−1) of the stage 100 (*n*−1), and a source coupled to the input node Q(n). The third transistor T3 comprises a gate coupled to the clock signal CK, a drain coupled to the source of the second transistor T2, and a source of a driving signal end of the next stage 100 (*n*+1).

The pull-up circuit 102 comprises a fourth transistor T4 and a fifth transistor T5. The fourth transistor T4 comprises a drain coupled to the first clock signal CK, a gate coupled to the input node Q(n), and a source coupled to the output end OUT(n). The fifth transistor T5 comprises a drain coupled to the first clock signal CK, a gate coupled to the input node Q(n), and a source coupled to the driving signal end ST(n).

The pull-down circuit 106 comprises a sixth transistor T6 for providing the supply voltage Vss to the input node Q(n) when being turned on. The sixth transistor T6 comprises a drain coupled to the input node Q(n), a gate coupled to the driving signal end ST(n+1) of the stage 100 (*n*+1), and the supply voltage $V_{SS}$.

Figure 4:
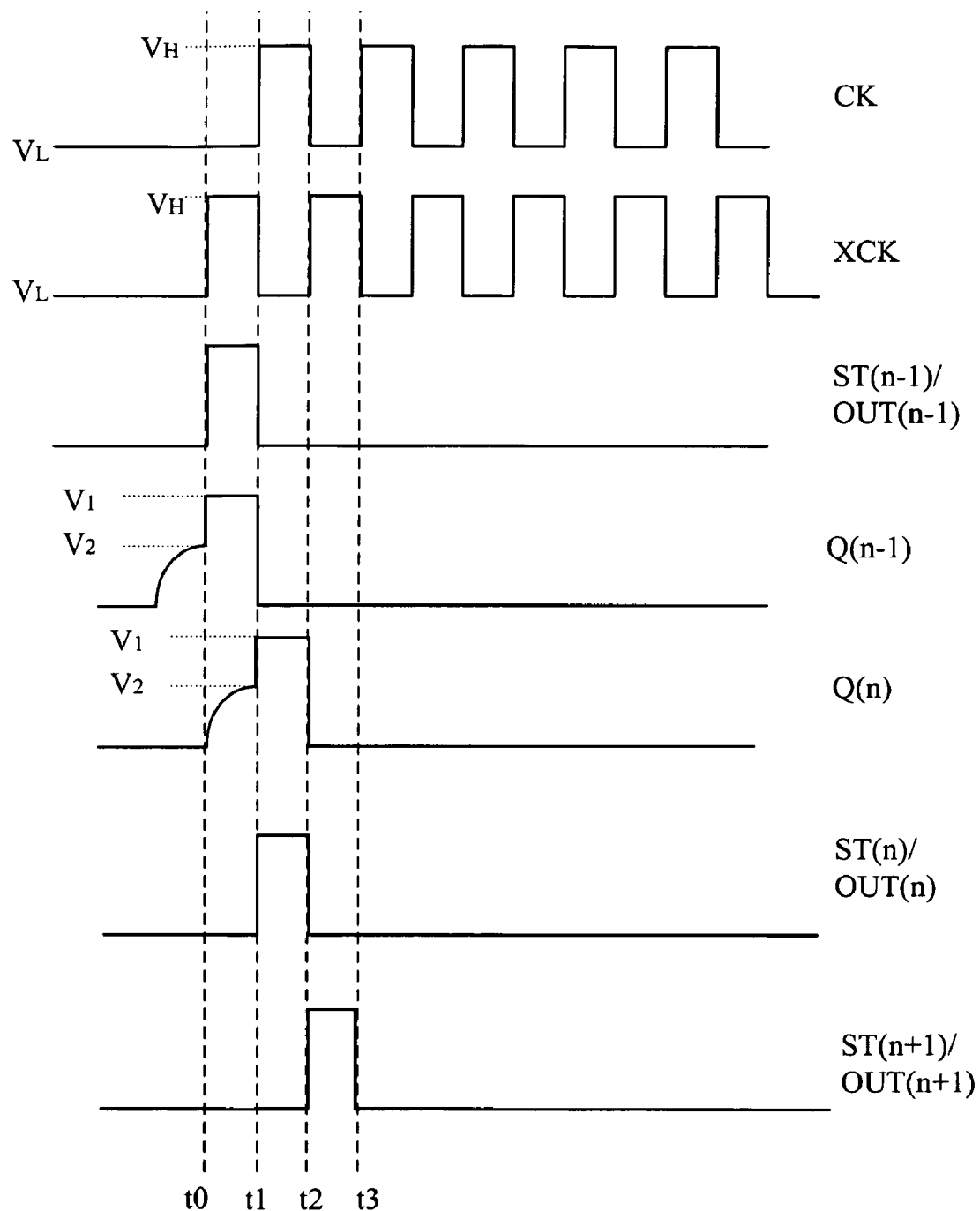
FIG. 4 shows a timing diagram of each signal and each node in FIG. 2.

Referring to FIG. 2 in conjunction to FIG. 4 showing a timing diagram of each signal and each node in FIG. 2, during a time period t1-t2, the first clock signal CK is at high voltage level $V_H$ so as to turn on the transistor T3, while the second clock signal XCK and the driving signal from the driving signal end ST(n+1) of the stage 100 (*n*+1) are at the low voltage level so as to pull down voltage level at the node P to low voltage level. At this moment, the transistors T1 and T6 are switched off due to their respective gates coupling to the low voltage level. However, the voltage level at the input node Q jumps from voltage level $V_2$ to $V_1$ due to capacitive effect. Therefore, the voltage level at the input node Q is at the high voltage level so as to turn on the transistor T4 and T5, and the first clock signal CK is transmitted to the output end OUT(n) and driving signal end ST(n) to output the high voltage level. It is noted that, at a transience of the time t1, a gate-source voltage drop of the transistor T1 converges to 0V, since both a transition of the driving signal of the driving signal end ST(n−1) from the high voltage level to the low voltage level, and a transition of the second clock signal XCK from the high voltage level to the low voltage level $V_H$ to $V_L$ happen. Upon the driving signal of the driving signal end ST(n−1) pulling down to supply voltage Vss, the gate voltage of the transistor T1 remains the low voltage level $V_L$, which may be controlled by an external circuit. Accordingly, a leakage current of the transistor T1 can be reduced by a control of the external voltage level.

After the time t3, when the transistor T3 is turned on in response to the first clock signal CK at high voltage level $V_H$, and the driving signal of driving signal end ST(n+1) is at the low voltage level, the voltage level at node P is pulled down to the low voltage level. In other words, the transistor T3 is used for pulling down the voltage level of the gate of the transistor T1 when the stage 100 (*n*) does not output, thereby improving stability of the transistor T1.

Figure 3B:
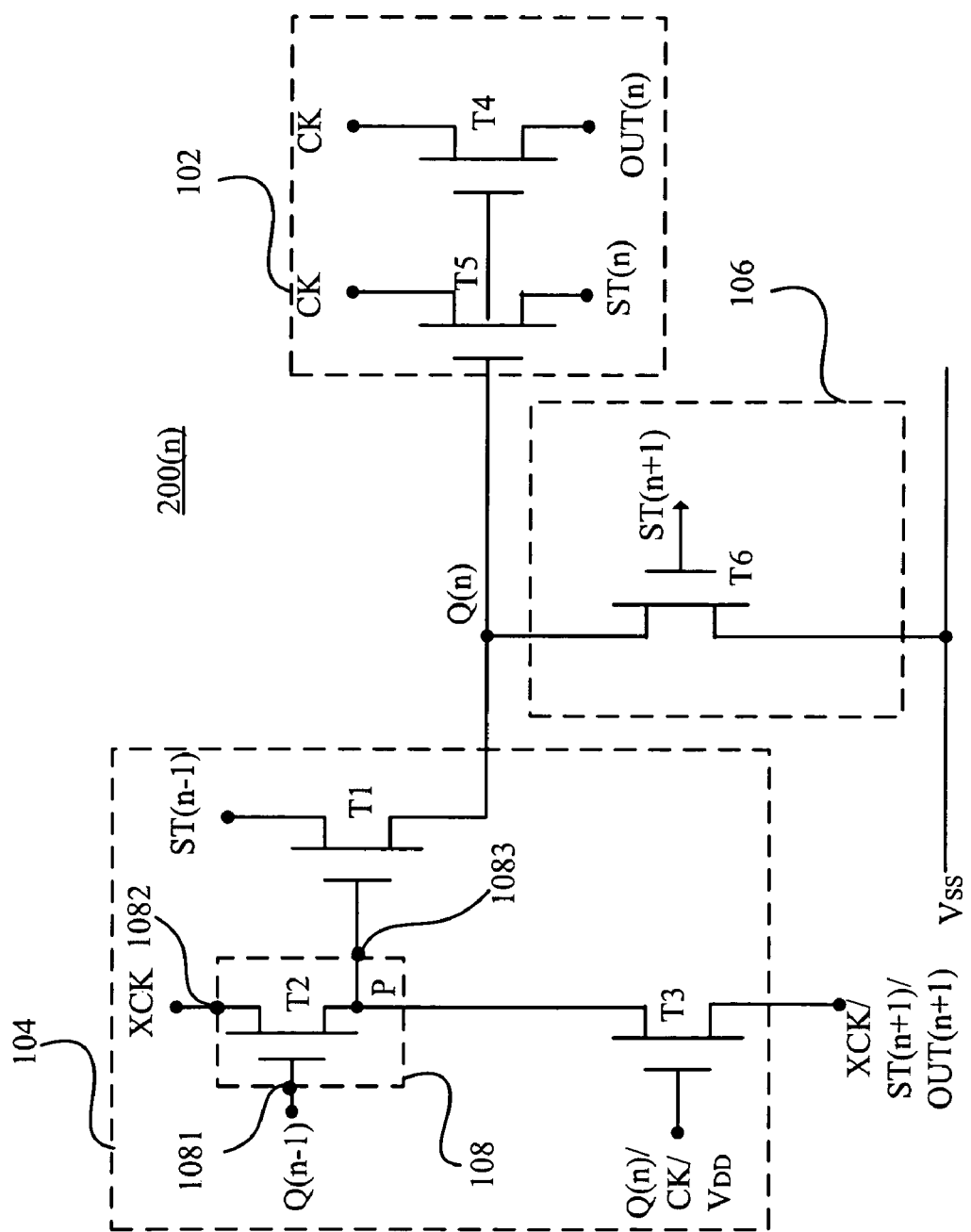
FIG. 3B illustrates a circuit diagram of a stage of the shift register according to a second embodiment of the present invention.

Referring to FIG. 3B illustrating a circuit diagram of a stage 200 (*n*) of the shift register according to a second embodiment of the present invention, differing from that, in the first embodiment, the gate and the source of the transistor T3 are coupled to the first clock signal CK and the driving signal end ST(n+1) of the stage 200 (*n*+1), respectively, the transistor T3 according to the second embodiment shown in FIG. 3B, the gate of the transistor T3 may be coupled to the input node Q(n), the first clock signal CK, or a supply voltage $V_{DD}$, while the source of the transistor T3 may be coupled to the second clock XCK, the driving signal end ST(n+1) of the stage 200 (*n*+1), or the output end OUT(n+1) of the stage 200 (*n*+1).

Figure 5A:
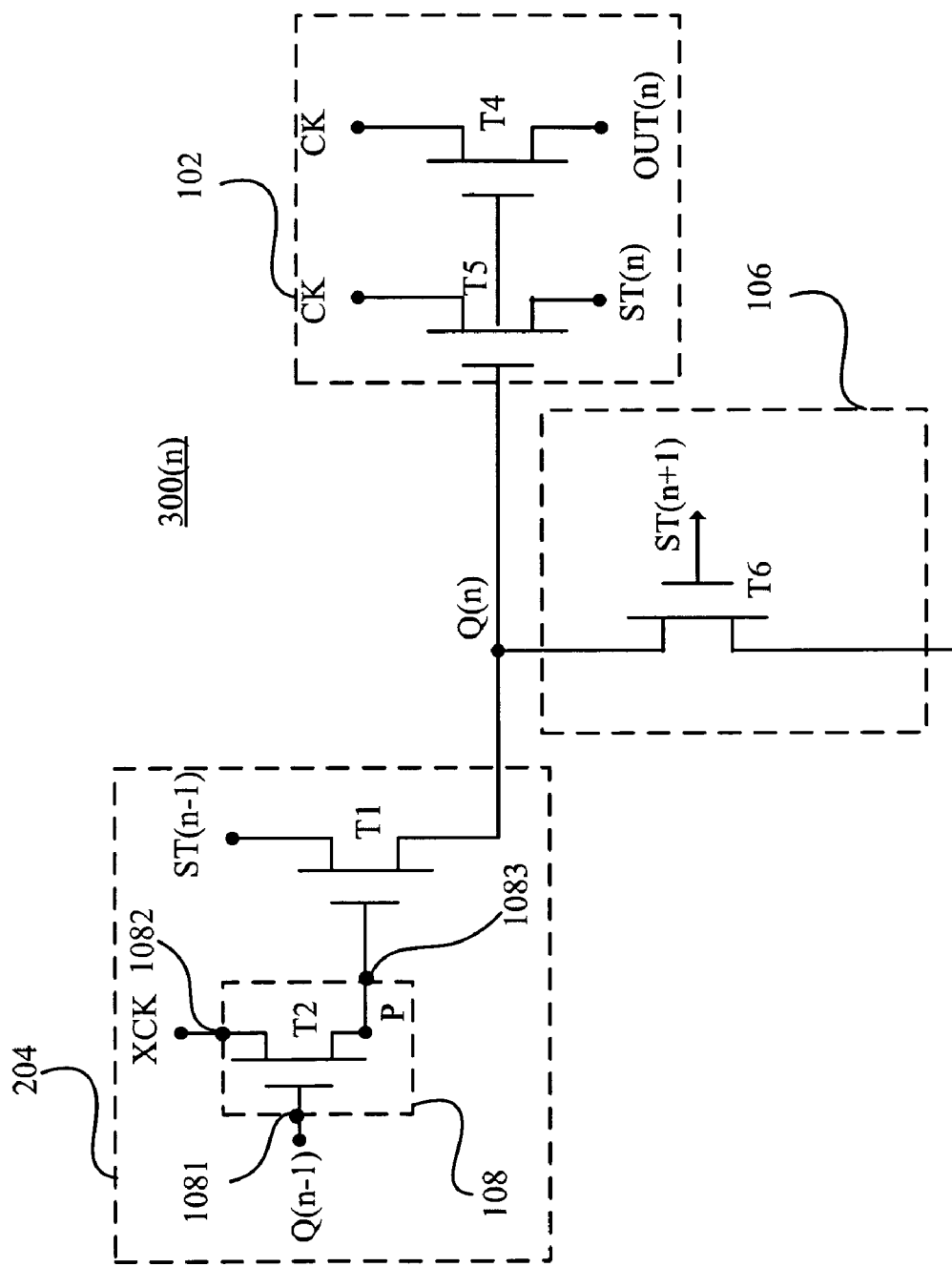
FIG. 5A illustrates a circuit diagram of a stage of the shift register according to a forth embodiment of the present invention.

Referring to FIG. 5A illustrating a circuit diagram of a stage 300 (*n*) of the shift register according to a third embodiment of the present invention, the pull-up circuit 204 shown in FIG. 5A is identical to the pull-up circuit 104 shown in FIG. 3A except a lack of the transistor T3. In this embodiment, the voltage level at the node P still to be pulled down to the low voltage $V_L$ via the transistor T1, in order to reduce the leakage current of the transistor T2. In addition, the gate and the source of the transistor T2 may be coupled to the input node Q(n−1) of the stage 300 (*n*−1) and the second clock XCK, respectively.

Figure 5B:
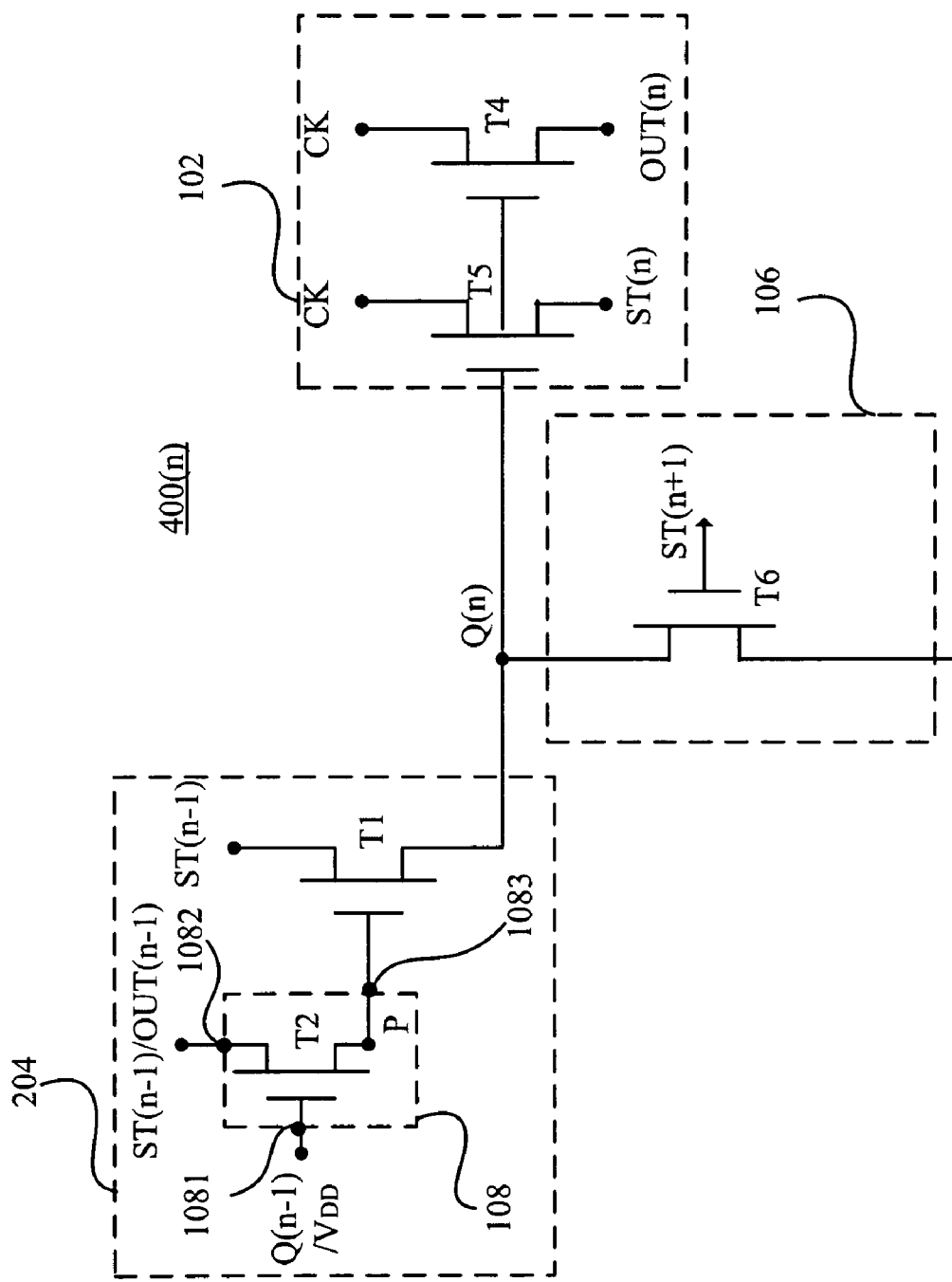
FIG. 5B illustrates a circuit diagram of a stage of the shift register according to a fourth embodiment of the present invention.

Referring to FIG. 5B illustrating a circuit diagram of a stage 400 (*n*) of the shift register according to a fourth embodiment of the present invention, the gate of the transistor T2 may be coupled to the input node Q(n−1) of the stage 400 (*n*−1) or supply voltage $V_{DD}$. The drain of the transistor T2 may be coupled to the second clock signal XCK or the driving signal end ST(n−1) of the stage 400 (*n*−1).

The shift register of the present embodiment can be applied to the gate driver of a LCD.

Compared to prior art, the present inventive shift register comprises the first transistor T1 and the third transistor T3, so that the voltage level on the gate of the first transistor T1 is controlled by means of the transistor T3 to compensate a threshold voltage variation of a transistor T1.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A shift register comprising:
   a plurality of stages connected in cascade, each stage comprising:
   a pull-up circuit coupled to a first clock signal for generating an output signal;
   a pull-up driving circuit coupled to the pull-up circuit comprising:
   a control circuit comprising a first input end coupled to an input node of a pull-up circuit of a previous stage, a second input end coupled to a second clock signal, and a third input end; and
   a first transistor comprising a gate coupled to the third input of the control circuit, a drain coupled to a driving signal end of the previous stage, and a source coupled to an input node of the pull-up circuit; and
   a pull-down circuit for providing a supply voltage to the input node of the pull-up circuit.

2. The shift register of claim 1, wherein the control circuit comprises a second transistor comprising a gate coupled to the first input end of the control circuit, a drain coupled to the second input end of the control circuit, and a source coupled to the third input end of the control circuit.

3. The shift register of claim 2, wherein the gate of the second transistor is coupled to the input end of the pull-up circuit of the previous stage, the drain of the second transistor is coupled to the second clock signal, and the source of second transistor is coupled to the gate of the first transistor.

4. The shift register of claim 3, wherein the pull-up driving circuit further comprises a third transistor comprising a gate coupled to the first clock signal, a drain coupled to the source of the second transistor, and a source coupled to a driving signal end of a next stage.

5. The shift register of claim 3, wherein the pull-up circuit comprises:
   a fourth transistor comprising a drain coupled to the first clock signal, a gate coupled to the input node of the pull-up circuit, and a source coupled to an output end; and
   a fifth transistor comprising a drain coupled to the first clock signal, a gate coupled to the input node of the pull-up circuit, and a source coupled to a driving signal end.

6. The shift register of claim 3, wherein the first clock signal is out of phase with the second clock signal by 180 degrees.

7. The shift register of claim 3, wherein the pull-down circuit comprises a sixth transistor comprising a drain coupled to the input node of the pull-up circuit, a gate coupled to the driving signal end of the next stage, and a source coupled to the supply voltage.

8. The shift register of claim 1 being applied for a liquid crystal display.

9. A shift register unit comprising:
   a pull-up circuit coupled to a first clock signal for generating an output signal;
   a pull-up driving circuit coupled to the pull-up circuit comprising:
   a control circuit comprising a first input end coupled to an input node of a pull-up circuit of a previous shift register unit, a second input end coupled to a second clock signal, and a third input end; and
   a first transistor comprising a gate coupled to the third input of the control circuit, a drain coupled to a driving signal end of the previous shift register unit, and a source coupled to an input node of the pull-up circuit; and
   a pull-down circuit for providing a supply voltage to the input node of the pull-up circuit.

10. The shift register unit of claim 9, wherein the control circuit comprises a second transistor comprising a gate coupled to the first input end of the control circuit, a drain coupled to the second input end of the control circuit, and a source coupled to the third input end of the control circuit.

11. The shift register unit of claim 10, wherein the gate of the second transistor is coupled to the input end of the pull-up circuit of the previous shift register unit, the drain of the second transistor is coupled to the second clock signal, and the source of second transistor is coupled to the gate of the first transistor.

12. The shift register unit of claim 11, wherein the pull-up driving circuit further comprises a third transistor comprising a gate coupled to the first clock signal, a drain coupled to the source of the second transistor, and a source coupled to a driving signal end of a next shift register unit.

13. The shift register unit of claim 11, wherein the pull-up circuit comprises:
   a fourth transistor comprising a drain coupled to the first clock signal, a gate coupled to the input node of the pull-up circuit, and a source coupled to an output end; and
   a fifth transistor comprising a drain coupled to the first clock signal, a gate coupled to the input node of the pull-up circuit, and a source coupled to a driving signal end.

14. The shift register unit of claim 11, wherein the pull-down circuit comprises a sixth transistor comprising a drain coupled to the input node of the pull-up circuit, a gate coupled to the driving signal end of the next shift register unit, and a source coupled to the supply voltage.

15. The shift register unit of claim 9, wherein the first clock signal is out of phase with the second clock signal by 180 degrees.

16. A shift register comprising:
   a plurality of stages connected in cascade, each stage comprising:
   a pull-up circuit coupled to a first clock signal for generating an output signal;
   a pull-up driving circuit coupled to the pull-up circuit comprising:
   a control circuit comprising a first input end coupled to a first signal end, a second input end coupled to a second signal end, and a third input end, wherein the control circuit comprises a second transistor comprising a gate coupled to an input end of the pull-up circuit of the previous stage, a drain coupled to the second input end of the control circuit, and a source coupled to the third input end of the control circuit; and
   a first transistor comprising a gate coupled to the third input of the control circuit, a drain coupled to a driving signal end of the previous stage, and a source coupled to an input node of the pull-up circuit; and
   a pull-down circuit for providing a first supply voltage to the input node of the pull-up circuit.

17. The shift register of claim 16, wherein the gate of the second transistor is coupled to the input end of the pull-up circuit of the previous stage, the drain of the second transistor is coupled to a second clock signal, and the source of second transistor is coupled to the gate of the first transistor.

18. The shift register of claim 16, wherein the drain of the second transistor is coupled to a driving signal end of the previous stage or an output end of the previous stage.

19. The shift register of claim 16, wherein the pull-up driving circuit further comprises a third transistor comprising a gate coupled to a third signal end, a drain coupled to the source of the second transistor, and a source coupled to a fourth signal end.

20. The shift register of claim 19, wherein the drain of the third transistor coupled to the source of the second transistor, and the gate of the third transistor is coupled to the first clock signal, the output end of the stage, or the first supply voltage.

21. The shift register of claim 20, wherein the source of the third transistor is coupled to a driving signal end of a next stage, or a second clock signal, or an output end of the next stage.

22. The shift register of claim 16, wherein the pull-up circuit comprises:
    a fourth transistor comprising a drain coupled to the first clock signal, a gate coupled to the input node of the pull-up circuit, and a source coupled to an output end; and
    a fifth transistor comprising a drain coupled to the first clock signal, a gate coupled to the input node of the pull-up circuit, and a source coupled to a driving signal end.

23. The shift register of claim 21, wherein the first clock signal is out of phase with the second clock signal by 180 degrees.

24. The shift register of claim 21, wherein the pull-down circuit comprises a sixth transistor comprising a drain coupled to the input node of the pull-up circuit, a gate coupled to the driving signal end of the next stage, and a source coupled to the first supply voltage.

25. The shift register of claim 16 being applied for a liquid crystal display.

* * * * *